(12) United States Patent
Fukuta et al.

(10) Patent No.: US 7,768,136 B2
(45) Date of Patent: Aug. 3, 2010

(54) SEALED-BY-RESIN TYPE SEMICONDUCTOR DEVICE

(75) Inventors: Kazuhiko Fukuta, Fukuyama (JP); Kenji Toyosawa, Fukuyama (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 493 days.

(21) Appl. No.: 11/344,084

(22) Filed: Feb. 1, 2006

(65) Prior Publication Data

US 2006/0170085 A1    Aug. 3, 2006

(30) Foreign Application Priority Data

Feb. 2, 2005    (JP)    ............... 2005-027056

(51) Int. Cl.
  *H01L 23/48*    (2006.01)
(52) U.S. Cl. ............ 257/778; 257/779; 257/781; 257/783
(58) Field of Classification Search .......... 257/778–783
  See application file for complete search history.

(56) References Cited

U.S. PATENT DOCUMENTS

| | | | |
|---|---|---|---|
| 5,448,451 A * | 9/1995 | Takubo et al. ............ 361/749 |
| 5,677,575 A | 10/1997 | Maeta et al. |
| 5,763,940 A | 6/1998 | Shibusawa et al. |
| 5,866,950 A | 2/1999 | Iwasaki et al. |
| 6,211,320 B1 * | 4/2001 | Dershem et al. ......... 526/329.1 |
| 6,342,577 B1 | 1/2002 | Konarski et al. |
| 6,372,839 B1 | 4/2002 | Ito et al. |
| 6,388,339 B1 * | 5/2002 | Yamamoto et al. .......... 257/787 |
| 7,253,078 B1 * | 8/2007 | Nguyen et al. ............. 438/411 |
| 2002/0033524 A1 | 3/2002 | Toyosawa et al. |
| 2002/0043704 A1 | 4/2002 | Seko |
| 2002/0058778 A1 | 5/2002 | Konarski et al. |
| 2002/0142167 A1 | 10/2002 | Yamaguchi et al. |
| 2005/0009240 A1 | 1/2005 | Yuzawa |

FOREIGN PATENT DOCUMENTS

| | | |
|---|---|---|
| JP | 07-226455 | 8/1995 |
| JP | 07-273244 | 10/1995 |
| JP | 08-153830 | 6/1996 |
| JP | 08-293529 | 11/1996 |
| JP | 11-345834 | 12/1999 |

(Continued)

OTHER PUBLICATIONS

Kacker et al., Impact of Underfill Geometry on Interfacial Delimitation, IEEE, Jun. 2006, 1604-610.*

(Continued)

*Primary Examiner*—Leonardo Andújar
(74) *Attorney, Agent, or Firm*—Harness, Dickey & Pierce, P.L.C.

(57) ABSTRACT

A semiconductor device such as a COF or the like is provided on a semiconductor chip on a film-like shaped flexile wiring substrate on which a wiring pattern is formed. Between the semiconductor chip and the flexile wiring substrate, a sealing resin is filled for protecting the semiconductor chip. In the semiconductor device, a resin trace is 0.1 to 1.0 mm in width and 10 μm in thickness, the resin trace being formed when applying the sealing resin along a longitudinal side of the semiconductor chip.

13 Claims, 9 Drawing Sheets

FOREIGN PATENT DOCUMENTS

| | | |
|---|---|---|
| JP | 2000-260790 | 9/2000 |
| JP | 2000-327884 | 11/2000 |
| JP | 2001-127216 | 5/2001 |
| JP | 2001-506313 | 5/2001 |
| JP | 2001-220428 | 8/2001 |
| JP | 2002-0302534 | 10/2002 |
| JP | 2003-055439 | 2/2003 |
| JP | 2003-174045 (A) | 6/2003 |
| JP | 2004-221319 | 8/2004 |
| JP | 2004-349343 | 12/2004 |
| JP | 2005-026447 | 1/2005 |
| TW | 565728 | 12/2003 |

OTHER PUBLICATIONS

Nguyen et al., Effect of Underfill fillet configuration on Flip chip Package Reliability, IEEE Apr. 2002, 291-303.*

Weidler et al., Optimizing Assembly Factors to Minimize Interlayer Die Stress in a PBGA Package, IEEE, Apr. 2002, 1172-1177.*

* cited by examiner

8: SPROCKET HOLE

APPLICATION OF RESIN ALONG
ONE LONGITUDINAL SIDE OF
SEMICONDUCTOR CHIP

RESIN REGION AFTER
RESIN APPLICATION

APPLICATION ORDER
: ①→②→③→④

APPLICATION OF RESIN ALONG
4 SIDES OF SEMICONDUCTOR CHIP

RESIN REGION AFTER
RESIN APPLICATION

SEALED-BY-RESIN TYPE SEMICONDUCTOR DEVICE

This Nonprovisional application claims priority under 35 U.S.C. §119(a) on Patent Application No. 027056/2005 filed in Japan on Feb. 2, 2005, the entire contents of which are hereby incorporated by reference.

FIELD OF THE INVENTION

The present invention relates to a semiconductor device called COF (Chip On Film), the semiconductor device including a semiconductor element on a flexible wiring substrate.

The present invention is applicable to a tape-carrier-package type semiconductor device called COF (Chip On Film), and a manufacturing method thereof. The Semiconductor device is arranged such that a wiring pattern on a flexible film is connected with an electrode of at least one semiconductor element, the electrode being for connecting the semiconductor element with an external circuit. An example of usage of the COF is a liquid crystal driver in which the semiconductor element servers as a liquid crystal driver IC and mounted on a flexible wiring substrate.

Moreover, beside an active-matrix type liquid crystal display modules and other type liquid crystal display modules such as the liquid crystal display module mentioned above, the semiconductor device is also applicable in electrophoretic display devices, twist ball display devices, reflection-type display devices in which a fine prism film is used, and display devices in which an optical modulation device, such as a digital mirror device or the like is used. Furthermore, the semiconductor device is also applicable to display devices whose light emitting device is an organic EL light emitting device, an inorganic EL light emitting device, or an LED (Light Emitting Diode), or the like, the light emitting device being variable in light emitting luminance, Field Emission display devices (FED) and plasma display devices.

BACKGROUND OF THE INVENTION

Recently, flexible wiring substrates for mounting a liquid crystal driver thereon have been improved to allow wring patter to have finer pitches, in order to cope with an improvement of the liquid crystal driver to have more outputs. Moreover, size reduction of the flexible wiring substrates including a protective resin portion for protecting a semiconductor element in order to cope with an improvement of a semiconductor device to be lighter in weight, thinner in thickness, a shorter in length, and smaller in dimension.

At this moment, for mounting of liquid crystal driver IC, COF (Chip On Film) is getting more popular than TCP (Tape Carrier Package) because COF allows finer pitch of the wiring patter and more freedom as to bending positions (where to be bent).

Mounting of COF is carried out as follows.

as illustrated in FIGS. 8(a) and 8(b), a writing patterns 102 and 103, made of copper, are formed on a flexible film 101a made of a polyimide. Then, as illustrated in FIG. 9, a semiconductor chip 104 with a bump electrode 105 is bonded on the flexible film 101a.

Next, a sealing resin to be an under-fill 106 is applied to fill and seal between the semiconductor chip 104 and the flexible wiring substrate 101. Then, a heat treatment is carried out thereby to cure the sealing resin.

By using a nozzle 141 jetting out the sealing resin therefrom in constant quantity, the application of the sealing resin for the under-fill 106 is carried out according to a resin application pattern predetermined in accordance with a shape of the semiconductor chip 104, as illustrated in FIGS. 10(a) and 10(b). Thereby, the sealing resin is introduced from four sides of the semiconductor chip 104. In this way, the sealing resin is introduced in a gap between the semiconductor ship 104 and the flexible wiring substrate. The sealing resin flows between the semiconductor ship 104 and the flexible wiring substrate by capillary phenomenon, thereby eliminating any empty space therebetween. As a result, fillet portions 106a and 106b are formed on whole sides of the semiconductor chip 104. Then, the flexible film 101a is cut out in a usage shape 109 (a shape in which the semiconductor device is supplied to a user) as illustrated in FIG. 8(a), the flexible, thereby producing an individual COF semiconductor 110 as illustrated in FIG. 8(b). The resin application pattern for the jetting out of the sealing resin for the under-fill 106 depends on a flowability of a resin to use. Therefore, the resin application pattern should have been such as to apply the resin along the four sides of the semiconductor chip 104 in order to fill the gap between the semiconductor chip 104 and the flexible wiring substrate 101 without air bubble therein. Moreover, the application of the sealing resin according to the resin application pattern causes a resin trace 106c, which has a thickness of 30 μm to 50 μm or more. With such a thick thickness, the resin remains clearly.

In order to cope with the improvement of the semiconductor device to be lighter in weight, thinner in thickness, shorter in length, and smaller in dimension, it is necessary to reduce not only the semiconductor chip itself but also a resin portion of the semiconductor chip.

COF semiconductor devices are advantageous in the greater freedom as to the bending portion. Regarding the freedom as to the bending portion, the smaller dimension of the resin portion is more preferable, because the resin portion is inflexible. If the resin sealing section was bent beyond its limit, such problems would be caused such as causing a crack in the sealing resin, pealing the sealing resin off from the flexible substrate.

In the conventional semiconductor device and its manufacturing method, the fillet portions 106a, 106b, and resin trace 106c, which are caused as a result of the formation of the under-fill 106, take a significant space, thereby forming a large resin portion. A mechanical design should be design such that the resin portion is not included in a bending region. Thus, a large resin portion becomes a large restriction against product miniaturization. Specifically, as illustrated in FIG. 10(b), the fillet portions 106a and 106b having the same width from the semiconductor chip 104, are in a surrounding of the semiconductor chip 104. Moreover, as illustrated in FIG. 9, the thickness of the resin trace 106c is so thick that it has a thickness in a range of 30 μm to 50 μm. Therefore, the resin trace 106c also forms a inflexible portion.

On the other hand, electric insulating resistance between the adjacent wiring patterns 102 and 102, and between the adjacent wiring patterns 103 and 103 is a factor most influential on reliability of the flexible wiring substrate 101 that is improved to have the wiring patterns 102 and 103 deposited with finer pitches. FIG. 11 illustrates a case where air bubbles 151 and 152 are entrapped when the sealing resin is introduced between the semiconductor chip 104 and the flexible wiring substrate 101 in order to form the under-fill 106 serving to protect the semiconductor 104, and fail to escape outside the sealing resin before the resin is cured, thereby remaining (a) below the semiconductor chip 104, (b) in contact with the bump electrode 105, (c) between the wiring patterns 102, or (d) between the wiring patterns 103. In this case, a space is produced in contact (a) below the semiconductor chip 104, (b) in contact with the bump electrode 105, (c) between the wiring patterns 102, or (d) between the wiring patterns 103. Moisture from outside, or residual ion component remaining in the resin would come and remain in the space. Migration would easily occur in such a space in which water or residual ion component is kept. The migration leads to deterioration of the electric insulating resistance between the terminals.

Moreover, the conventional sealing resin has a high viscosity that gives the conventional sealing resin a poor flowability. Due to the poor flowability, the conventional sealing resin should be applied along the four sides of the semiconductor chip 104. Otherwise, the fillets would be uneven as illustrated in FIG. 12, where only one fillet section 106a is formed but the fillet section 106b is not formed. Such failing in filling, such as leaving the wiring patterns 102 or 103 uncovered leads to a qualitative problem.

The technique disclosed in Japanese Unexamined Patent Publication, Tokukai, No. 2003-174045 (published on Jun. 20, 2003) includes the step of defoaming after the step of applying the sealing resin, in order to prevent the air gap in the under-fill. In the step of applying the sealing resin, the sealing resin is used whose viscosity is approximately 100 cp (1000 mPa·S) at 25° C. and which is heated up to 50° C. so as to lower the viscosity to approximately 250 cp (250 mPa·S). The application of sealing resin is followed by leaving the sealing resin for 120 sec. Then, the step of defoaming is carried out by attaching a tool to a surface of the flexible wiring substrate for 5 sec, the tool being heated up to a temperature in a range of 140° C. to 200° C. The application of the sealing resin is carried out along the four edges or periphery of the semiconductor chip. Moreover, the viscosity of the sealing resin is 1000 mPa·S at 25° C., which is so high to give the sealing resin a poor flowability. In order to lower the viscosity, the sealing resin is heated up to 50° C. However, if the heating time became too long, curing reaction would take place thereby increasing the viscosity of the sealing resin. This results in a lower flowability and shorter pot life of the sealing resin, thereby deteriorating workability.

SUMMARY OF THE INVENTION

An object of the present invention is to provide a semiconductor device in which a width of a region of a sealing resin used for protection of a semiconductor element is reduced so that an outer dimension of the semiconductor device can be smaller, and a method of manufacturing thereof. A semiconductor device according to the present invention is a semiconductor device (e.g., COF or the like) in which a semiconductor element is mounted on a flexible wiring substrate having a film-like shape and a wiring pattern thereon. In order to attain the object, the semiconductor device according to the present invention is arranged such that a sealing resin fills a gap between the flexible wiring substrate and the semiconductor element, the sealing resin protecting the semiconductor element; and a resin trace is 0.1 to 1.0 mm in width and not more than 10 μm in thickness, the resin trace being formed when the sealing resin is applied along at least one side of the semiconductor element via a nozzle, the at least one side being at least one longitudinal side thereof.

A method according to the present invention is a method of manufacturing a semiconductor device (e.g., COF or the like) in which a semiconductor element is mounted on a flexible wiring substrate having a film-like shape and a wiring pattern thereon. In order to attain the object, the method according to the present invention is arranged as to include applying a sealing resin along at least one side of the semiconductor element via a nozzle, the at least one side being at least one longitudinal side thereof, so as to fill, with a sealing resin, a gap between the flexible wiring substrate and the semiconductor element, the applying of the sealing resin causing a resin trace which is 0.1 to 1.0 mm in width and not more than 10 μm in thickness.

Conventionally, the resin trace formed as a result of the application of the sealing resin is 30 to 50 μm or more in thickness because the sealing resin has a high viscosity. The resin trace should not be flexed.

On the other hand, the present invention is arranged that the sealing resin is applied, via the nozzle, along the longitudinal side of the semiconductor element, and the resin trace is in a range of 0.1 to 1.0 mm in width and is not more than 10 μm in thickness.

Because the thickness of the resin trace is not more than 10 μm, it becomes possible to prevent the sealing resin in the resin trace from being cracked or stripped off due to flexing stress. Moreover, the resin trace become a resin that can be flexed, even though the resin trace is conventionally a region which should not be flexed. This reduces the resin region that should not be flexed. With this, the semiconductor device becomes smaller in apparent outside dimensions. That is, an inflexible region of the semiconductor device is smaller than the conventional semiconductor device.

Therefore, it becomes possible to provide (a) a semiconductor device in which a region width of the sealing region for protecting semiconductor element is reduced thereby to have a larger flexible region and reduce the outside dimensions of the semiconductor device, and (b) a manufacturing method thereof.

Furthermore, a semiconductor device according to the present invention is a semiconductor device in which a semiconductor element is mounted on a flexible wiring substrate having a film-like shape and a wiring pattern thereon. In order to attain the object, semiconductor device according to the present invention is arranged such that a sealing resin fills a gap between the flexible wiring substrate and the semiconductor element, the sealing resin protecting the semiconductor element; peripheral resin portions are formed respectively on longitudinal sides of the semiconductor element when the sealing resin is applied along one of the longitudinal sides of the semiconductor element via a nozzle; and the peripheral resin portion on the one of the longitudinal side is not more than 1.0 mm in width from the semiconductor element and the peripheral resin portion on the other one of the longitudinal side is not more than 0.8 mm.

Moreover, a method according to the present invention is a method of manufacturing a semiconductor device in which a semiconductor element is mounted on a flexible wiring substrate having a film-like shape and a wiring pattern thereon. In order to attain the object, the method according to the present invention is arranged to include applying a sealing resin along one of the longitudinal sides of the semiconductor element via a nozzle, so as to fill, with a sealing resin, a gap between the flexible wiring substrate and the semiconductor element and to form peripheral resin portions respectively on longitudinal sides of the semiconductor element the peripheral resin portion on the one of the longitudinal side being not more than 1.0 mm in width from the semiconductor element and the peripheral resin portion on the other one of the longitudinal side being not more than 0.8 mm.

Conventionally, the viscosity of the sealing resin is high. Therefore, the sealing resin should be applied along four sides of the semiconductor element. As a result, the peripheral resin portion formed around the semiconductor element cannot be 1.0 mm or less in width from the semiconductor element.

On the other hand, in the present invention, the peripheral resin portion on the one of the longitudinal side (along which the sealing resin is applied) is not more than 1.0 mm in width from the semiconductor element and the peripheral resin portion on the other one of the longitudinal side is not more than 0.8 mm.

In the present invention, the sealing resin is caused to have a low viscosity unlike the conventional art. As a result, it becomes possible to arrange such that the sealing resin is applied along one longitudinal side of the semiconductor element, unlike the conventional sealing resin application method in which the sealing resin is applied along the four sides thereof. This makes it possible to attain these dimensions and thickness of the peripheral resin portions. Therefore, the peripheral resin portions becomes significantly smaller in width. Especially, the peripheral resin portion on the one of the longitudinal side (along which the sealing resin is applied) becomes 0.8 mm or less. This reduces the resin region that should not be flexed. With this, the semiconductor device becomes smaller in apparent outside dimensions. That is, an inflexible region of the semiconductor device is smaller than the conventional semiconductor device.

Additional objects, features, and strengths of the present invention will be made clear by the description below. Further, the advantages of the present invention will be evident from the following explanation in reference to the drawings.

DESCRIPTION OF THE EMBODIMENTS

Figure 1:
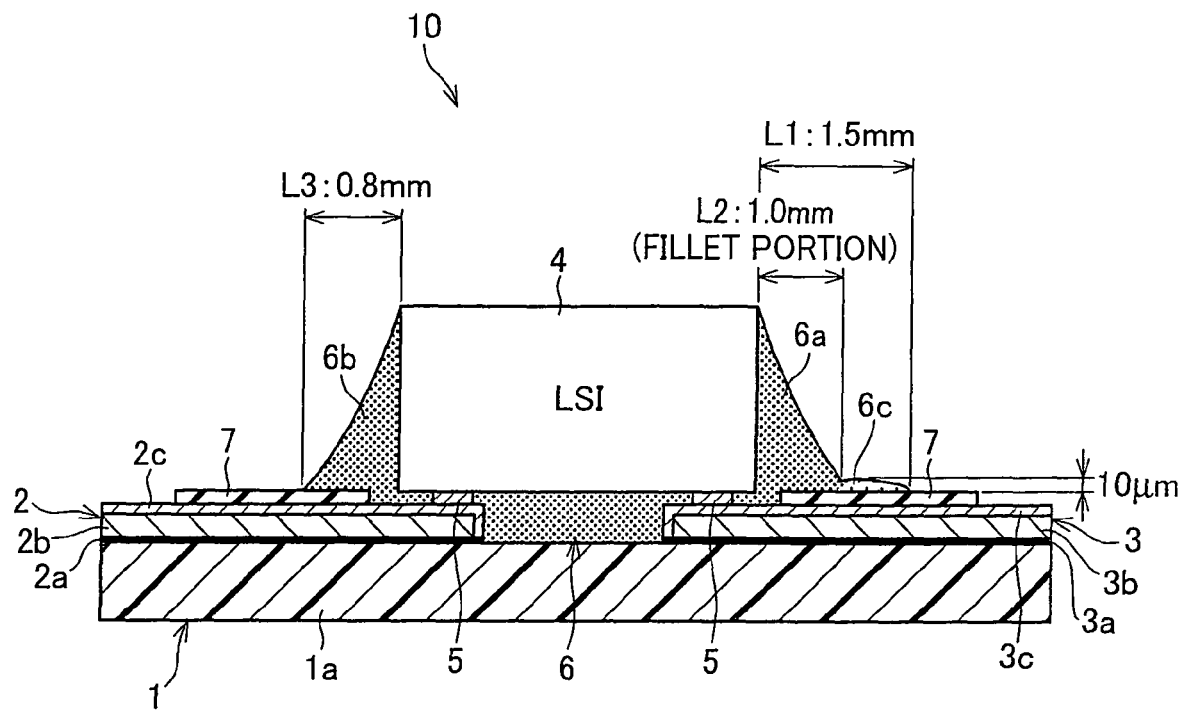
FIG. 1(a) illustrates one embodiment of a semiconductor device according to the present invention, and is a sectional view taken on line X-X of FIG. 2(b).
FIG. 1(b) is a plan view illustrating fillet portions of sealing resin of the semiconductor device and resin on resin trace as a result of resin application.
Figure 1:
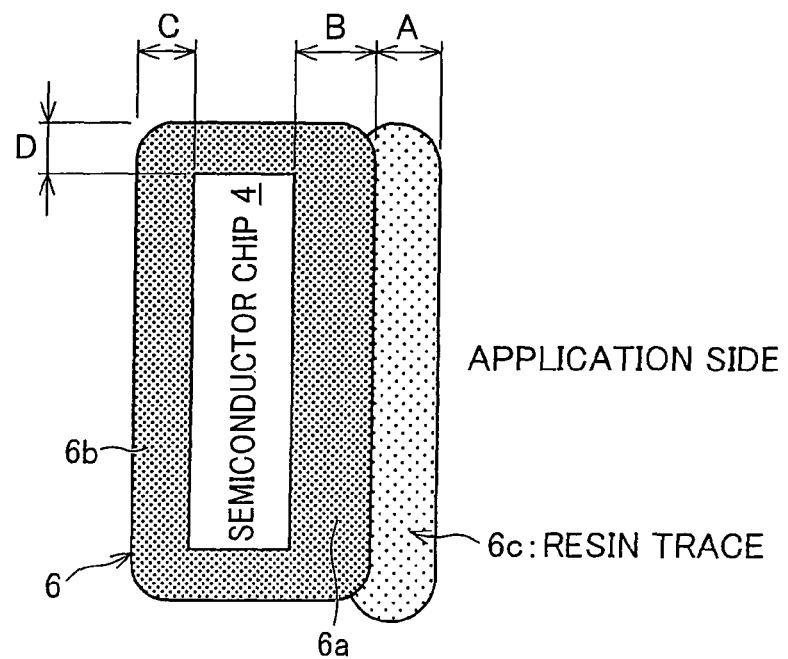
Figure 2:
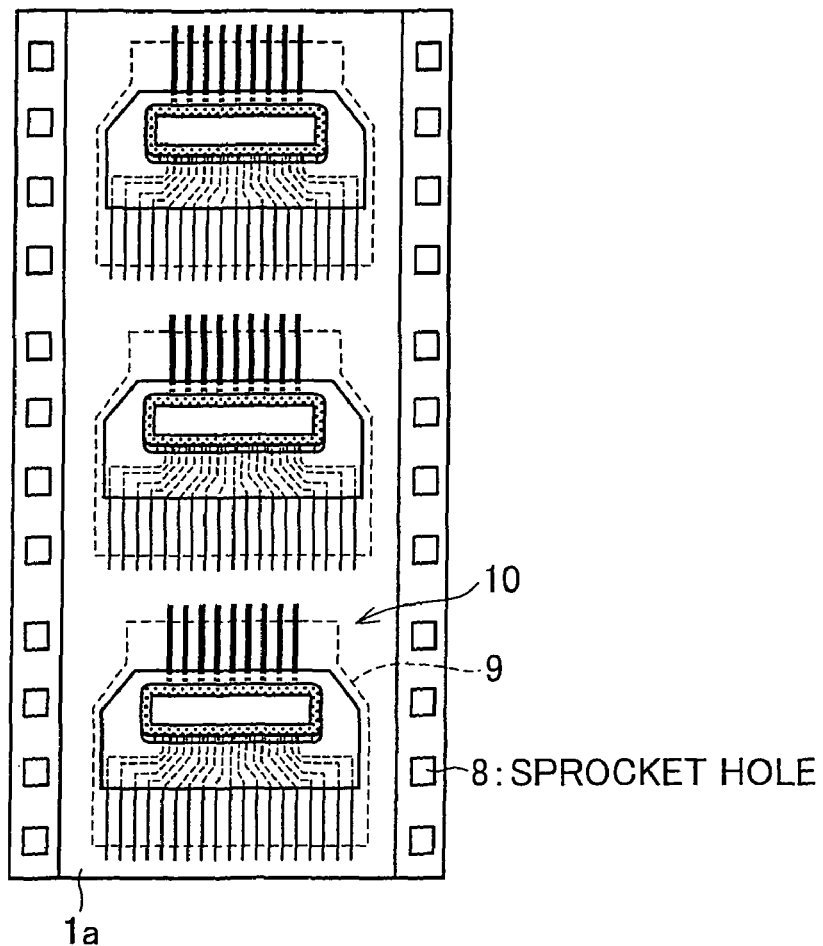
FIG. 2(a) is a plan view illustrating semiconductor devices sequentially formed on a flexible film.
FIG. 2(b) is a plan view illustrating an individual semiconductor device cut out from the flexible film.
Figure 2:
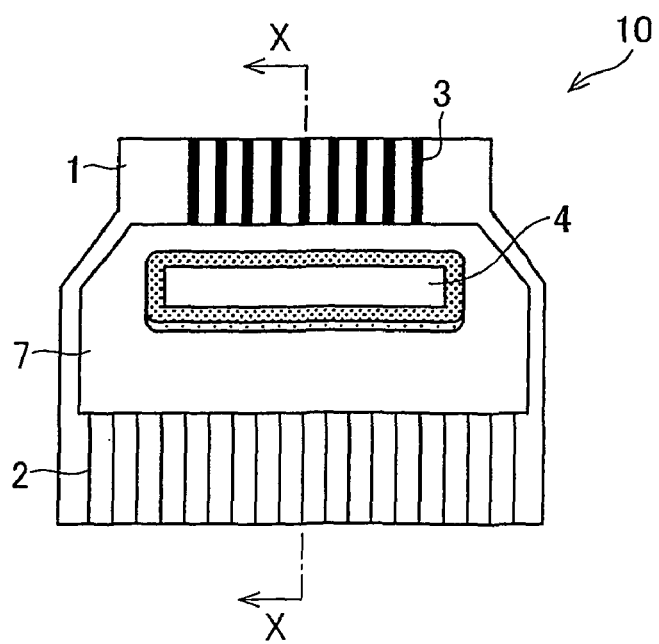
Figure 3:
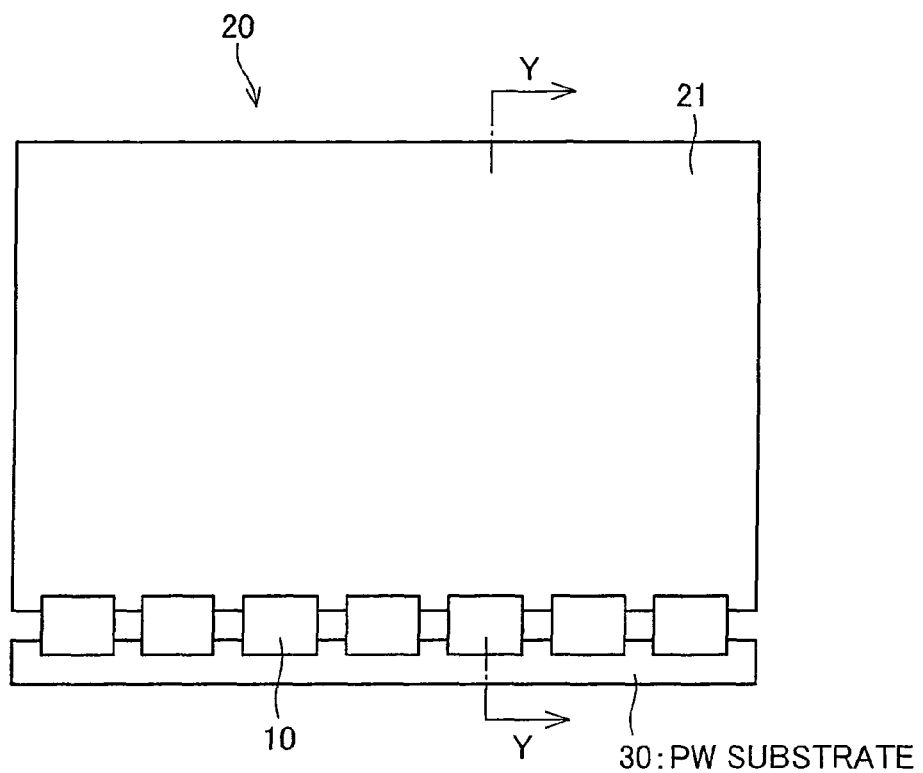
FIG. 3(a) is a plan view illustrating a liquid crystal module in which a liquid crystal display panel and a PW substrate are connecting with the semiconductor devices.
FIG. 3(b) is a sectional view taken on lien Y-Y of FIG. 3(a).
Figure 3:
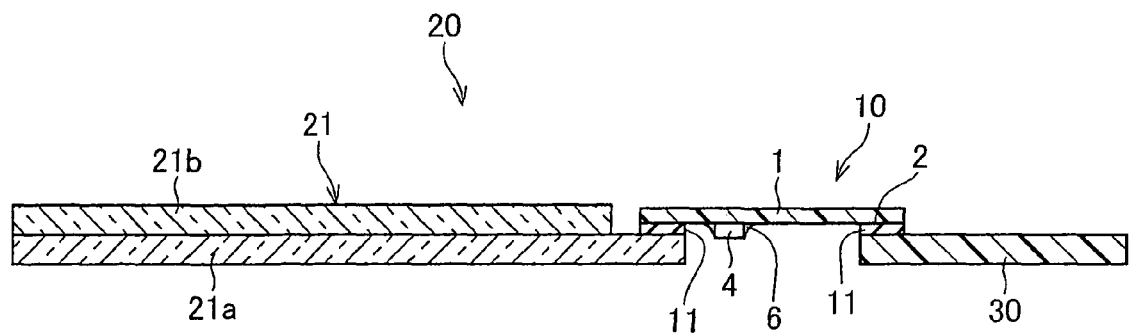

One embodiment of the present invention is described below, referring to FIGS. 1 to 7.

A semiconductor device 10 of the present embodiment is a COF (Chip On Film) as illustrated in FIGS. 2(a) and 2(b). The COF has a flexible-film-based structure. The semiconductor device 10, which is COF, includes a semiconductor chip 4 mounted on a flexible wiring substrate 1 prepared by forming wiring patterns 2 and 3 on a flexible film 1a. In the COF, the semiconductor chip 4 is directly mounted on the flexible film 1a.

The wiring patterns 2 and 3 are, for example, made of cupper (Cu) plated with tin (Sn), but are not limited to this. The wiring patterns 2 and 3 may made of cupper (Cu) cupper (Cu) plated with gold (Au), or may be made of cupper (Cu) without platting. The semiconductor chip 4 is provided with bump electrodes 5 made of gold (Au) as illustrated in FIG. 1(a). By connecting the bump electrodes 5 respectively with the wiring patterns 2 and 3, the semiconductor chip 4 is electrically connected with the wiring patterns 2 and 3.

Moreover, the semiconductor device 10 is arranged such that the flexible wring substrate 1 is coated with a solder resist 7 made of an electrically insulating material, except the wiring patterns 2 and 3, and the semiconductor chip 4. With this, it is possible to protect the wring patterns 2 and 3 from being attached with conductive foreign material, thereby preventing a short circuit.

Further, the semiconductor device 10 is sealed with an under-fill 6 made of resin. The under fill 6 fills, for example, a gap formed between the semiconductor chip 4 and the flexible wiring substrate 1 after bonding the bump electrode 5 and the wiring patterns 2 and 3 on the flexible wiring substrate 1 and seals the peripheries of the semiconductor ship 4.

This gives the semiconductor device 10 better moisture resistance and mechanical strength. In the introduction of the under-fill 6, the under-fill 6 filled a gap between the semiconductor chip 4 and the flexible wiring substrate 1 flows out to the periphery of the semiconductor chip 4 by the capillary phenomenon.

The under-fill 6 flown out to the periphery of the semiconductor chip 4 is referred to as fillet portions 6a and 6b. Moreover, as illustrated in FIG. 1(b), the application of the under-fill 6 leaves a resin trace in a region in which the resin is applied via a later-described nozzle 41. This resin trace is referred to as a resin trace 6c.

As illustrated in FIG. 2(a), a plurality of the semiconductor devices 10 are provided sequentially on the flexible film 1a. The semiconductor devices 10 are cut out along usage shapes 9 as illustrated in FIG. 2(a), thereby to prepare individual semiconductor devices 10 on which the semiconductor chip 4 is mounted on the flexible wiring substrate 1 as illustrated in FIG. 2(b).

As illustrated in FIG. 2(a), the flexible film 1a has sprocket holes 8 on both sides thereof. The sprocket holes 8 serve as perforation holes for transportation. By protrusions respectively engaged with the sprocket holes 8, the flexible film 1a can be transported. This allows flow production of the semiconductor devices 10.

The semiconductor devices 10 thus completed are for example mounted on a liquid crystal module 20 as illustrated as FIGS. 3(a) and 3(b). The liquid crystal module 20 serves as a display module. The semiconductor devices 10 are used for driving a liquid crystal display panel 21.

That is, the liquid crystal module 20 is provided with the semiconductor devices 10 mounted on the liquid crystal display panel 21 including a TFT (Thin Film Transistor) substrate 21a and a color filter substrate 21b. While being connected with the liquid crystal display panel 21 on one side, the semiconductor devices 10 are attached with a PW (Printed Wiring) substrate 30 on the other side. The PW substrate serves as a circuit board. The semiconductor devices 10 are attached with the liquid crystal display panel 21 and PW substrate 30 by using an anisotropic conductive adhesive agent (ACF: anisotropic Conductive Film) 11 thereby being electrically connected with them. The anisotropic conductive adhesive agent 11 is an adhesive film having a thickness of 15 to 45 μm, in which conductive particles having diameters in a range of 3 to 15 μm are dispersed. Because the conducive particles are dispersed in the film, the anisotropic conducive adhesive agent 11 is electrically insulating by itself. By applying heat and pressure on the anisotropic conductive adhesive agent 11 interposed between circuit patterns, the anisotropic conductive adhesive agent 11 bonds the semiconductor devices 10 with the substrates while electrically connecting electrodes with their counterparts located above or below them (i.e., on the other side of the anisotropic conductive adhesive agent 11) while electrically insulating the electrodes with their counterparts located adjacently.

Here, the COF-type semiconductor device 10 having the above arrangement is described in terms of its manufacturing method in which the present embodiment is characterized, and a feature attained by the manufacturing method.

The semiconductor device 10 is manufactured as follows. Firstly, as illustrated in FIGS. 1(a), 2(a), and 2(b), barrier metal layers 2a and 3a and cupper (Cu) film 2b and 3b are formed on a flexible film made of a polyimide. The copper films 2b and 3b are patterned by etching. The patterned copper films 2b and 3b are plated with tin (Sn) thereby to form the wiring patterns 2 and 3. Next, by printing, the solder resist 7 is applied so as to coat the wiring patterns 2 and 3 excepts a mounting portion for mounting the semiconductor chip and terminal portions for the connection with the liquid crystal panel 21 and PW substrate 30, in order to protect the wiring patterns 2 and 3. Then, the solder resist is dried to be hardened. In this way, a tape carrier film is produced. Then, the semiconductor chip 4 having bump electrodes 5 are boned on the tape carrier film. This boding step is referred to as inner lead bonding (ILB).

After the inner lead bonding, the sealing resin is applied to fill a gap between the semiconductor chip 4 and the flexible wiring substrate 1 so as to form the under-fill 6 for protecting the semiconductor chip 4. The sealing resin is then heated to cure. The application of the under-fill 6 is carried out by jetting out via the nozzle 41 the sealing resin in a constant quantity in a resin application pattern predetermined according to a shape of the semiconductor chip 4 as illustrated in FIGS. 4(a) and 4(b), in order to introduce the sealing resin between the semiconductor chip 4 and the flexible wiring substrate 1 from a longitudinal side of the semiconductor chip 4. The sealing resin flows between the semiconductor chip 4 and the flexible wiring substrate 1 by the capillary phenomenon, making no empty space therebetween. As a result, the fillet portions 6a and 6b are formed on whole sides of the semiconductor chip 4. After conducting a final test on the semiconductor device 10, the mounting of the COF semiconductor device 10 is completed.

The resin application pattern used in jetting the sealing resin of the under-fill 6 depends on the flowability of the resin used as the sealing resin. Therefore, the resin should be applied along the four sides of the semiconductor chip 4 in the conventional art in order to fill, with the resin, the gap between the semiconductor chip 4 and the flexible wiring substrate 1 with no empty space and to form the fillet portions 6a and 6b on the whole sides of the semiconductor chip 4.

Moreover, according to the conventional technique, the resin trace 6c is so thick that it has a thickness in a range of 30 to 50 μm or more. As a result the resin is clearly remained as the resin trace.

In the present embodiment, the resin to form the under-fill 6 has a low viscosity such as 50 to 600 mPa·s when applied. Thereby, the flowability of the resin at the application is increased.

Specifically, as illustrated in Table 1, the sealing resin has a viscosity of 50 to 600 mPa·s at 25° C. As a result, the sealing rein has excellent filling property. (That is, with such a sealing resin, the filling the gap and making the fillets 6a and 6b can be done excellently.) Moreover, it would become easy to cause air gap formation or unsuccessful filling of the sealing resin if the viscosity of the sealing resin was 800 mPa·s or more. Moreover, in the range of the viscosity of 50 to 600 mPa·s, the viscosity of 50 to 200 mPa·s tends to cause dripping of the sealing resin from the nozzle 41, and requires an applying device to have a system for preventing the dripping. In this point, with the viscosity of 300 to 900 mPa·s at 25° C., the sealing resin has a good workability. By heating the semiconductor chip 4, the viscosity can be lowered to increase the flowability of the sealing resin. From these points, in the present embodiment, the viscosity of the sealing resin is most preferably in a range of 300 to 600 mPa·s at 25° C. overall.

TABLE 1

Relationships between resin viscosity, filling property, and workability at resin application.

| Sealing Resin Viscocity (mPa·s) | Overall Evaluation | Filling Property of Sealing Resin | Workability of Sealing Resin |
|---|---|---|---|
| 50 | Δ | ○ Good | Δ (Dripping from Nozzle) |
| 100 | Δ | ○ Good | Δ (Dripping from Nozzle) |
| 200 | Δ | ○ Good | Δ (Dripping from Nozzle) |
| 300 | ○ | ○ Good | ○ Good |
| 400 | ○ | ○ Good | ○ Good |
| 500 | ○ | ○ Good | ○ Good |
| 600 | ○ | ○ Good | ○ Good |
| 700 | Δ | ○~Δ Good | ○ Good |
| 800 | Δ | Δ (Air Bubble) | ○ Good |
| 900 | Δ | Δ (Air Bubble) | ○ Good |
| 1000 | X | Δ (Air Bubble) | Δ (Instable Jetting Quantity) |
| 1100 | X | X (Unsuccessful Filling) | X (Instable Jetting Quantity) |
| 1200 | X | X (Unsuccessful Filling) | X (Instable Jetting Quantity) |

TABLE 1-continued

Relationships between resin viscosity, filling property, and workability at resin application.

| Sealing Resin Viscocity (mPa·s) | Overall Evaluation | Filling Property of Sealing Resin | Workability of Sealing Resin |
|---|---|---|---|
| 1300 | X | X (Unsucessful Filling) | X (Instable Jetting Quantity) |

Note:
○ indicates "good property".
○~Δ indicates "good to insufficient property"
Δ indicates "insufficient property"
X indicates "bad property"

Moreover, in the present embodiment, the semiconductor chip 4 is preheated before applying the sealing resin via the nozzle 41, so that the filling is carried out with the sealing resin heated up to a temperature in the order of 60 to 120° C. Moreover, the gap between the semiconductor chip 4 and the flexible wiring substrate 1 is narrow and the quantity of the under fill 6 is small. The temperature of the under-fill 6 is heated up to the temperature of the semiconductor chip 4 promptly after the resin is applied.

Figure 5:
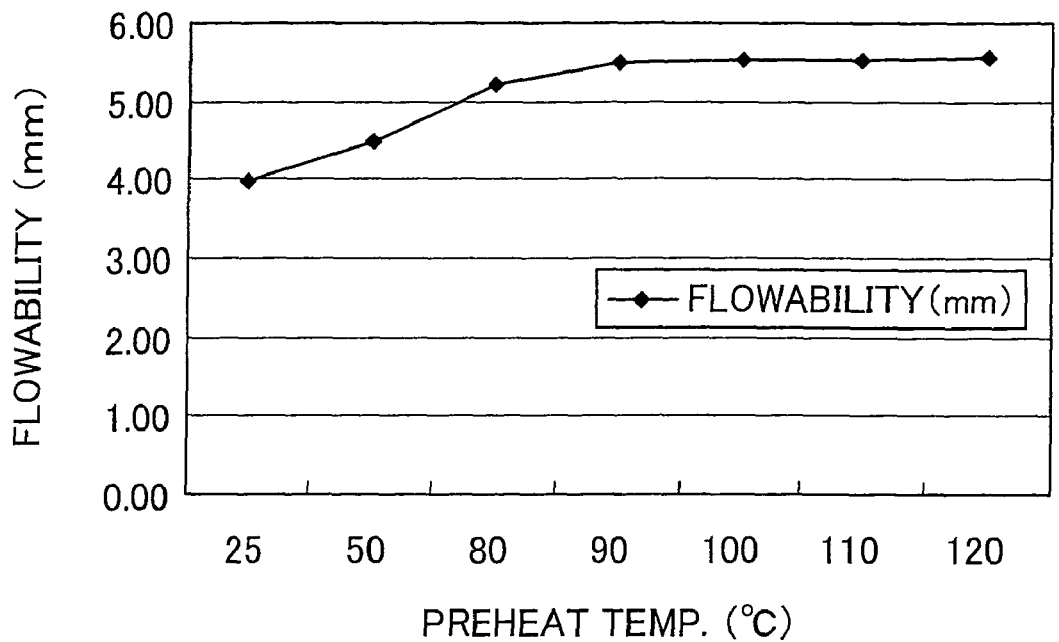
FIG. 5 is a graph illustrating a relation between heating temperature (pre heat) of the sealing resin and flowability thereof.
Figure 6:
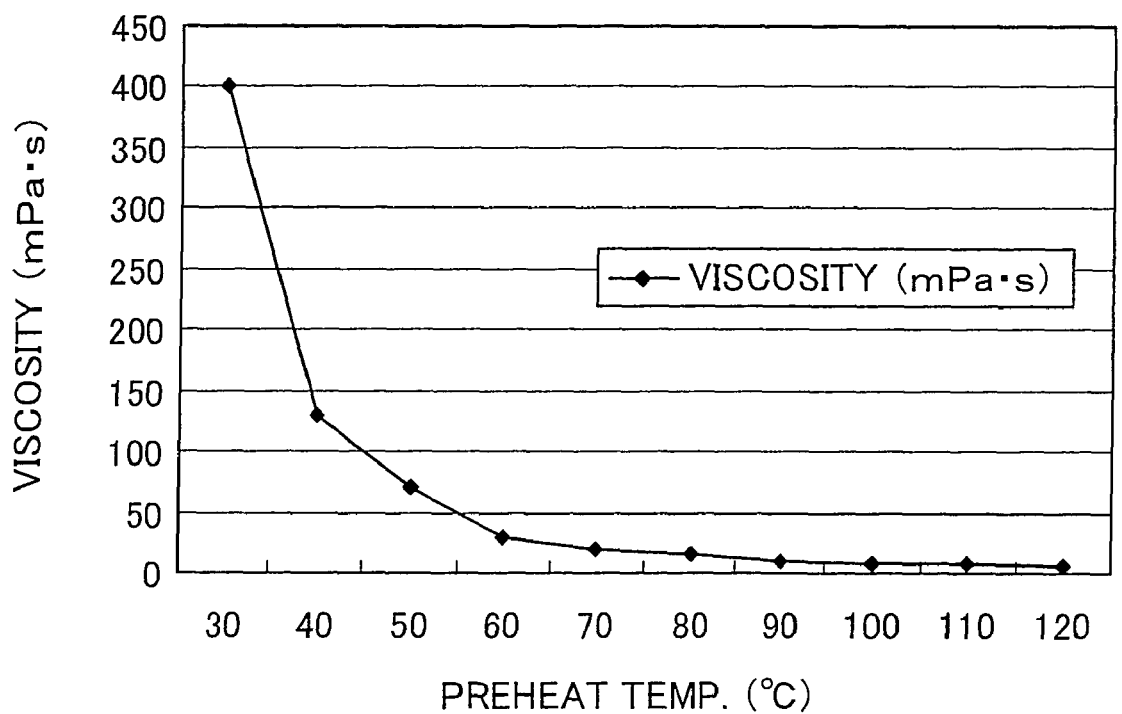
FIG. 6 is a graph illustrating a relation between heating temperature (pre heat) of the sealing resin and viscosity thereof.

The preheating of the semiconductor chip 4 is to increase the flowability of the sealing resin by lowering the viscosity of the sealing resin by heating the sealing resin as illustrated in FIGS. 5 and 6. In the present embodiment, it is preferable that the preheating temperature of the semiconductor chip 4 be a temperature in a range of 60 to 120° C., which is most effective for attaining desirable flowability. Moreover, it is not preferable to heat the sealing resin above 120° C., because the flowability of the resin is hard to increase with such a temperature that causes sudden progress of the thermal curing of the sealing resin and an increase in viscosity.

There is another reason for heating the temperature of the sealing resin in the present embodiment. An epoxy-based resin, which is generally used as the sealing resin, has a viscosity of 700 mPa·s or more at normal temperature and pressure (25° C. and 1 atm) in general. Therefore, it is difficult to obtain a sealing resin that shows good filling property at the normal temperature and pressure (25° C. and 1 atm). Good filling property of the sealing resin can be attain easily by heating such a resin to lower the viscosity thereof, even if the resin has a high viscosity at the normal temperature and pressure (25° C. and 1 atm).

Figure 10:
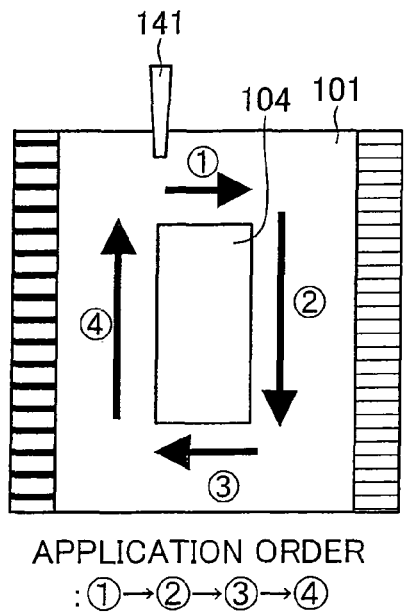
FIG. 10(a) is a plan view illustrating how the sealing resin is applied in a manufacturing process of the semiconductor device.
FIG. 10(b) is a plan view illustrating the fillets portion and resin trace of the applied sealing resin.
Figure 10:
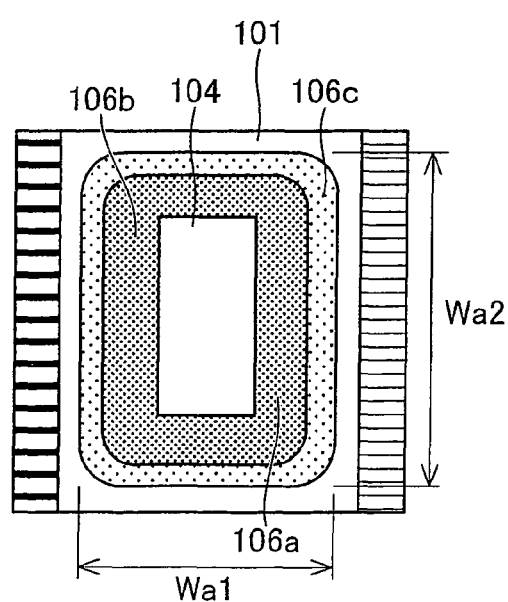
Figure 11:
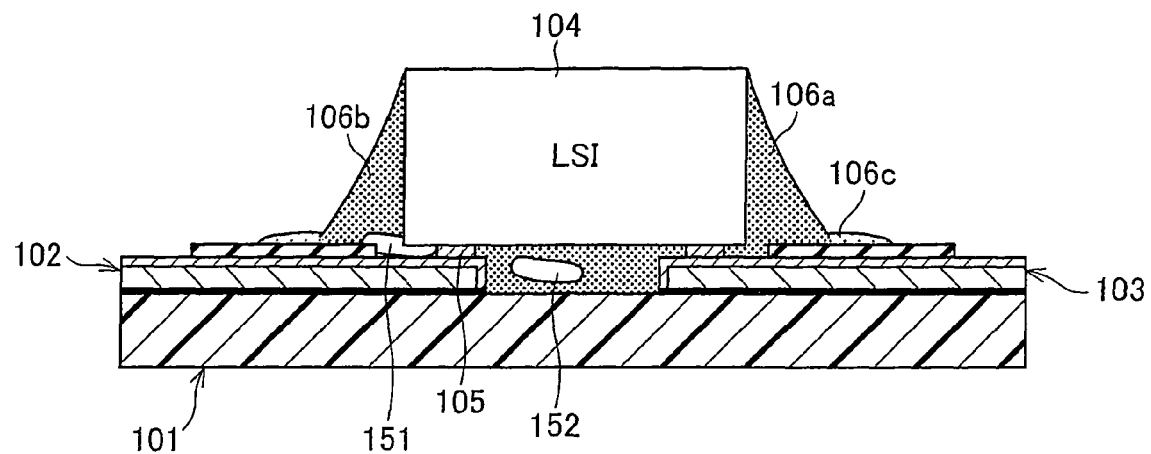
FIG. 11 is a cross sectional view illustrating a semiconductor device in which an air bubble is entrapped in the sealing resin.
Figure 12:
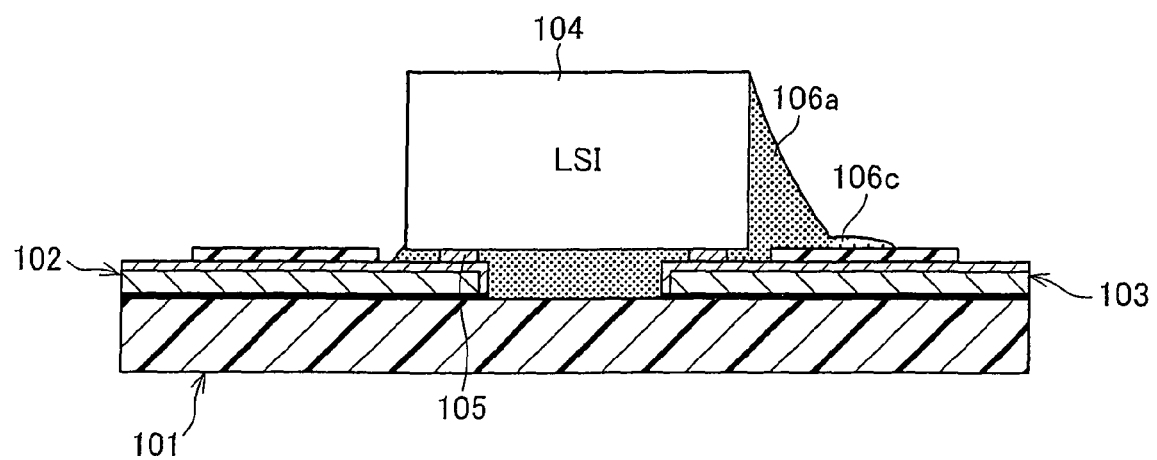
FIG. 12 is a cross sectional view illustrating a semiconductor device in which one of fillets portion is not formed thereby leaving an internal pattern uncovered, after the application of the sealing resin.

Meanwhile, conventionally, the sealing resin should be jetted out in a constant quantity so as to be applied along the four sides of the semiconductor chip 104 as illustrated in FIG. 10(*a*), in order to fill the gap between the semiconductor chip 104 and the flexible wiring substrate 101 so as to protect the semiconductor chip 104. The present embodiment is, however, arranged such that the sealing resin is applied in a constant quantity along one longitudinal side of the semiconductor chip 4, as illustrated in FIG. 4(*a*).

By this "one-side application", the air bubble entrapped in the sealing resin of the under-fill 6 when the sealing resin is introduced between the semiconductor chip 4 and the flexible wiring substrate 1 can more easily escape from the sealing resin before the resin is cured, compared with the conventional technique in which the resin is applied along the four sides. That is, the air bubble escapes from the sides from which the sealing resin is not applied. This prevents the air bubble from remaining the sealing resin.

Moreover, by applying the sealing resin along one longitudinal side of the semiconductor chip 4, a width A of the resin trace 6*c* could become 0.43 mm for example, as illustrated in FIG. 1(*b*). This width A of 0.43 mm is within the range of 0.1 to 1.0 mm. Further, a width B of the fillet portion 6*a* from the semiconductor chip 4 could become 0.92 mm, for example. This width B of 0.92 mm is not more than 1.0 mm. Further, a width C of the fillet portion 6*b* from the semiconductor chip 4 could become 0.55 mm, for example. This width C is not more than 0.8 mm. Further, widths of fillet portions along short sides of the semiconductor chip 4 were, for example, 0.59 mm from the semiconductor chip 4. Moreover, the thickness of the resin trace 6*c* was 3 μm.

Figure 4:
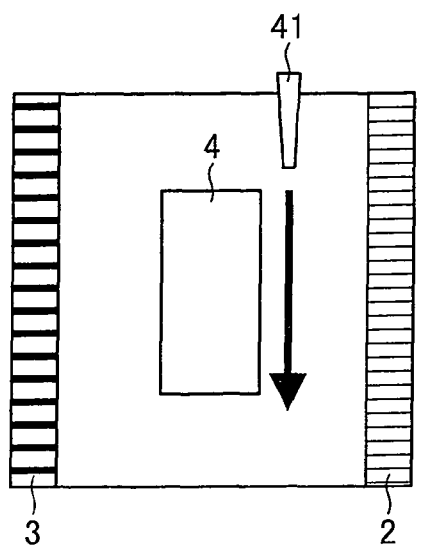
FIG. 4(a) is a plan view illustrating how the sealing resin is applied in a manufacturing process of the semiconductor device.
FIG. 4(b) is a plan view illustrating the fillets portion and resin trace of the applied sealing resin.
Figure 4:
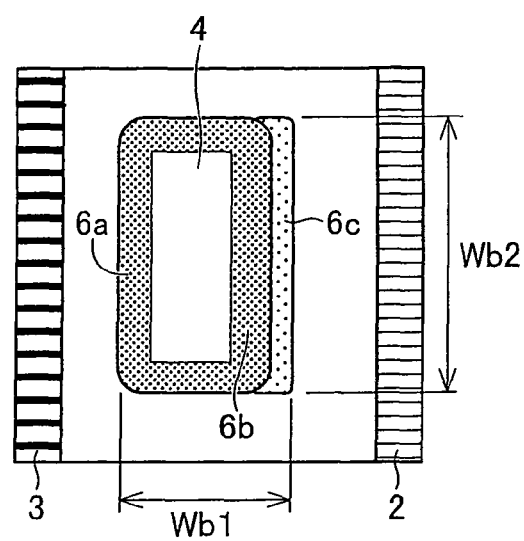

As a result, Wb1 in FIG. 4(*b*) is shorter than conventional Wa1 in FIG. 10(*b*), where Wb1 and Wa1 are widths including a width of the resin region (fillet portions 6*a* and 6*b*+resin trace 6*c*)+the width of semiconductor chip. Moreover, Wb2 in FIG. 4(*b*) is shorter than conventional Wa2 in FIG. 10(*b*), where Wb2 and Wa2 are length including a length of the resin region.

Figure 7:
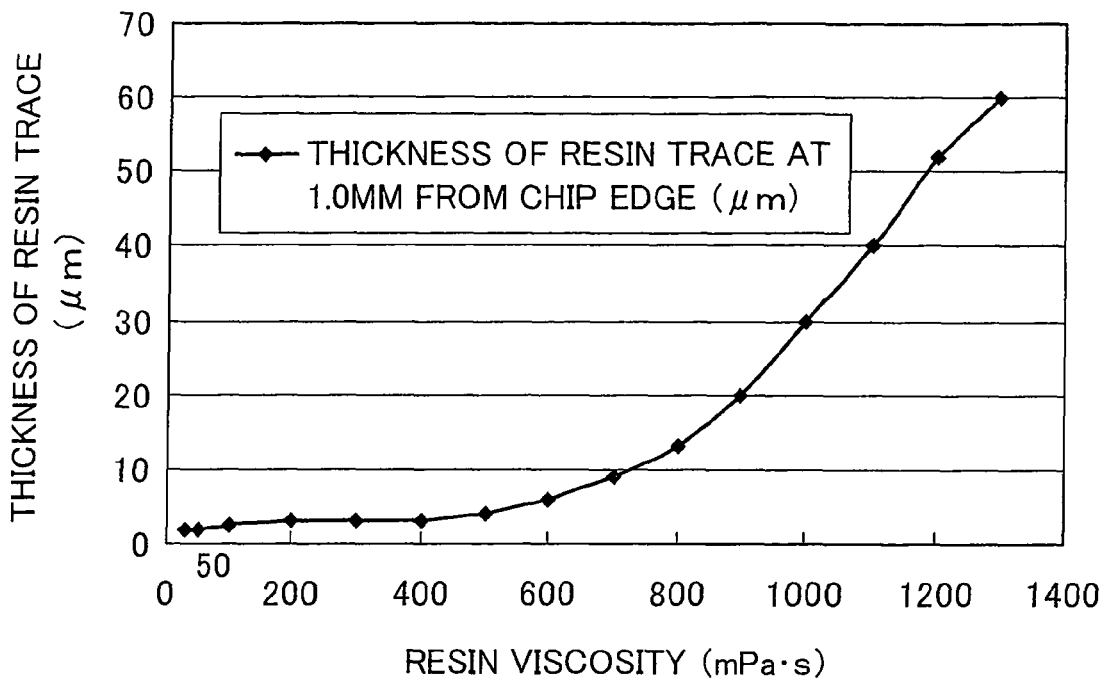
FIG. 7(a) is a graph illustrating a relation between the viscosity of the sealing resin and a thickness of the resin on the resin trace.
FIG. 7(b) is a cross sectional view illustrating the resin trace.
Figure 7:
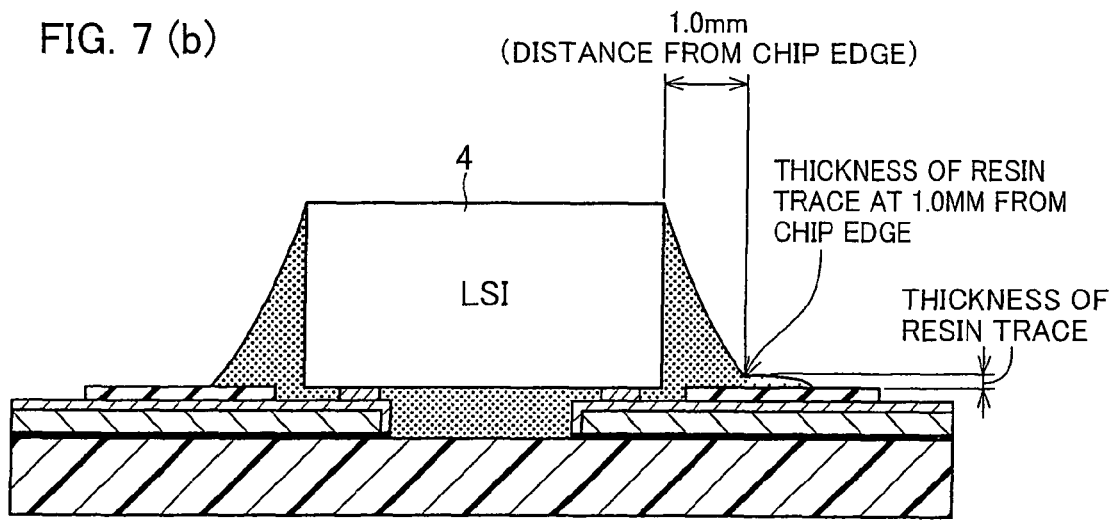
Figure 8:
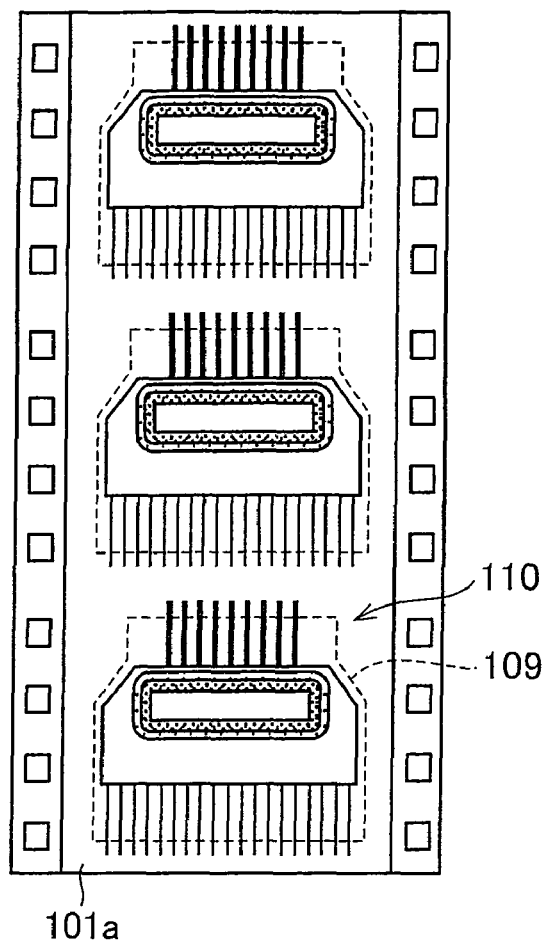
FIG. 8(a) is a plan view illustrating conventional semiconductor devices sequentially formed on a flexible film and FIG. 8(b) is a plan view illustrating an individual conventional semiconductor device cut out from the flexible film.
Figure 8:
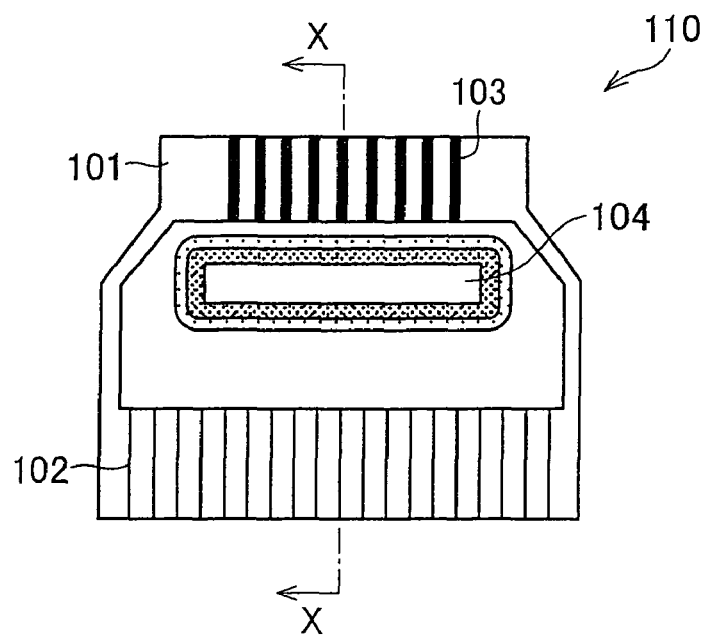
Figure 9:
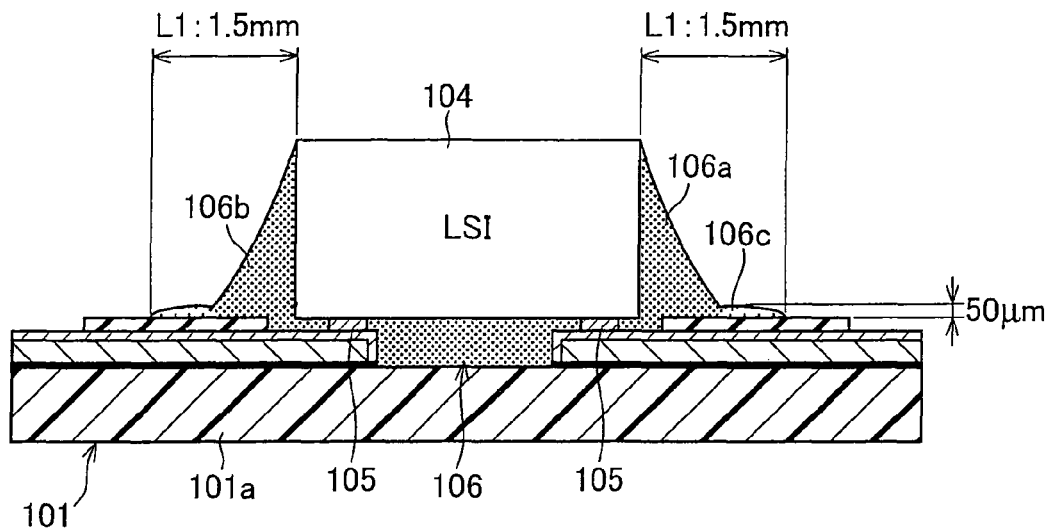
FIG. 9 is a cross-sectional view taken of line X-X of FIG. 8(b).

Moreover, the present embodiment especially attains a thin thickness of resin trace 6*c* by increasing the flowability of the sealing resin. The conventional sealing resin has a high viscosity of 900 mPa·s or higher as illustrated in FIG. 7(*a*). Because of this, the conventional resin trace 106*c* has a thickness of 20 μm or thicker, as illustrated in FIG. 7(*b*). On the other hand, in the present embodiment, the sealing resin has a viscosity in a range of 50 to 600 mPa·s at 25° C., and the viscosity is further lowered by preheating the semiconductor chip 4 to a temperature in a range of 60 to 120° C. before applying the sealing resin. With this, it is easy to attain a thickness of the resin trace 6*c* not more than 10 μm.

As seen from Table 2, the use of the conventional resin leads to a problem in that flexing the resin trace 106*c* causes cracking in the resin. In the present embodiment in which the thickness of the resin trace 6*c* is not more than 10 μm, the flexing the resin trace 6*c* will not cause cracking. This makes it possible to narrow a region where flexing stress should not be applied.

TABLE 2

Thickness of resin trace and occurrence of cracking in resin when the resin trace is flexed.

| Thickness of Resin Trace (μm) | Resin Cracking when flexed |
|---|---|
| 3 | ○ None |
| 5 | ○ None |
| 10 | ○ None |
| 20 | ○~Δ None, Wrinkle |
| 30 | Δ Wrinkle |
| 40 | Δ Wrinkle |
| 50 | Δ~X Crack |
| 100 | X Crack |

Note:
○ indicates "good property".
○~Δ indicates "good to insufficient property"
Δ indicates "insufficient property"
X indicates "bad property"

Incidentally, it is conventionally necessary to increase recognizability of the resin trace 106*c* because the resin trace 106*c* should not be flexed. Thus, it is conventional necessary to add a color agent (dye) in the sealing resin in a range of 0.3 to 0.5 wt % as in conventional examples in Table 3, in order to clearly show the resin trace 106*c* by giving a thicker color to the resin trace 106*c*. That is, the mixing ratio of the coloring material in the conventional resin is 0.5 wt %, for example.

TABLE 3

Mixing ratio of sealing resin

|  | Example (wt %) | Conventional Example |
| --- | --- | --- |
| Epoxy Resin + Curing Agent | 96.75 | 99.3 |
| Coloring Agent (Dye) | 0.15 | 0.5 |
| Other additive | 3.1 | 0.2 |
| Total | 100 | 100 |

On the other hand, the resin trace 6c has a thin thickness in the present embodiment. The thin thickness allows the resin trace 6c to be flexible. However, it is necessary for the sealing resin to have a high recognizability in order to clearly distinct the fillet portions 6a and 6b having the thickness of 30 μm or more from the resin trace 6c having the thickness of 10 μm or less.

Therefore, the present embodiment is arranged such that the mixing ratio of the coloring agent in the sealing resin is for example 0.15 wt %. The sealing resin of the present embodiment is lighter in color than the conventional sealing resin.

As shown in Table 4, it was confirmed by an experiment that borders between (a) the fillet portions 6a and 6b and (b) the resin trace 6c were recognizable when the mixing ratio of the coloring agent (dye) in the sealing resin was in a range of 0.1 to 0.3 wt %. The above mixing ratio of the coloring agent (dye) in the present embodiment is based on the confirmation. It is preferable that the mixing ratio of the coloring agent (dye) be in a range of 0.15 to 0.20 wt %.

TABLE 4

Relationship between mixing ratio of coloring agent and recognizability

| Amount of Coloring Agent added (wt %) | Recognizability between Resin Trace and Fillet |
| --- | --- |
| 0.00 | X (Impossible) |
| 0.05 | X (Difficult) |
| 0.10 | Δ (Intermediate) |
| 0.15 | ○ (Easy) |
| 0.20 | ○ (Easy) |
| 0.25 | Δ (Intermediate) |
| 0.30 | Δ (Intermediate) |
| 0.40 | X (Difficult) |
| 0.50 | X (Difficult) |
| 0.60 | X (Difficult) |
| 0.80 | X (Difficult) |

In the present invention, the mixing ratio of the other additive(s) is 3.1 wt %, which is higher than the conventional example in which it is 0.2 wt %. This is because the present embodiment adopts such measures to avoid an undesirable viscosity increase of the sealing resin that, for a curing accelerator added as a thermal curing reaction initiator for the sealing resin, a curing accelerator with which such an undesirable viscosity increase will not occur is used in the present embodiment. In order to avoid the undesirable viscosity increase due to the curing accelerator, it is preferable that the curing accelerator be capsulized so that the curing accelerator will not react at low temperature, or that the curing accelerator have a molecular structure that gives low reactivity or unreactivity at low temperatures.

As described above, in the semiconductor device 10 according to the present embodiment and its manufacturing method, the sealing resin used in COF is arranged to have a low viscosity so as to have a high flowability, unlike the conventional art. Because of this, the followings become possible.

That is, the application of the sealing resin can be carried out by applying the resin along one longitudinal side of the semiconductor chip 4, unlike the conventional art in which the sealing resin should be applied along the four sides of the semiconductor chip 4. As a result, on that side of the semiconductor chip 4 on which the resin is applied, the fillet portion 6a can be not more than 1.0 mm, which is less than 1.5 mm in the conventional art. On that side of the semiconductor chip 4 on which the resin is not applied, the fillet portion 6b can be not more than 0.8 mm.

Moreover, the applying the sealing resin along one side realizes a shorter tact time to take applying the sealing resin than the applying the sealing resin along four sides. As a result, the resin applying device can have higher throughput capacity.

Moreover, compared with the applying the sealing resin along four sides, the applying the sealing resin along one side makes it easier to escape, from the sealing resin, the air bubble entrapped in the sealing resin in introducing the sealing resin in the gap between the semiconductor chip 4 and the flexible wiring substrate 1. As a result, it becomes possible to present the air bubble from remaining in the sealing resin, thereby eliminating the air gap in the semiconductor device 10.

Moreover, by arranging such that the resin trace 6c has a thickness not more than 10 μm, it becomes possible to prevent resin of the resin trace 6c from being cracked or striped off due to flexing stress applied thereon. As a result, the resin trace 6c, which should not be flexed in the conventional art, can be included in the flexible region, thereby narrowing an inflexible resin region. Because of this, the semiconductor device 10 can be smaller in outside dimension than the conventional semiconductor device.

Moreover, by appropriately adding the coloring agent in the sealing resin of the semiconductor chip 4, the border between (a) the fillet portions 6a and 6b and (b9 the resin trace 6c becomes more recognizable, thereby making it easy to manage the resin region.

Example

For the production of the semiconductor device 10, a sealing resin was applied in a constant quantity via the nozzle 41 along one side of the semiconductor chip 4 as illustrated in FIG. 4(*a*). The sealing resin contained the coloring agent by 0.15 wt % and had a viscosity of 400 mPa·s at 25° C., as shown in Table 3. The application of the resin was preceded by preheating the semiconductor chip 4 to 90° C. by using a heater, in order to increase the flowability of the sealing resin that would be the under-fill 6 in the gap between the semiconductor chip 4 and the flexible wiring substrate.

Next, in order to stabilize shapes of the fillets 6a and 6b and the resin trace 6c and to harden the resin, the semiconductor device 10 is treated for a predetermined time enough for the curing the resin, in a curing oven whose temperature is increased to a predetermined temperature with a hot-air circulation or far infra-red heater. Thereby, the curing of the sealing resin is completed.

Final dimensions of the semiconductor device 10 manufactured in the above manufacturing method are, as illustrated in FIG. 1(*b*): the width A of the resin trace 6c was 0.43 mm; the width B of the fillet portion 6a from the semiconductor chip 4 was 0.92 mm; the width C of the fillet 6b from the semiconductor chip 4 was 0.55 mm; the widths of fillet portions on the shorter sides of the semiconductor chip 4 were 0.59 mm from the semiconductor chip 4; and the thickness of the resin trace 6c was 3 µm. As described above, the semiconductor device and its manufacturing method according to the present invention are preferably arranged such that the sealing resin has a viscosity in a range of 50 to 600 mPa·S at 25° C.

With this arrangement, the sealing resin for use in filling the gap between the flexible wiring substrate and semiconductor element is lowered unlike the conventional art, thereby to increase the flowability of the sealing resin. This allows the application of the sealing resin along one longitudinal side of the semiconductor element, unlike the conventional art in which the sealing resin should be applied along the four sides of the semiconductor element.

Furthermore, this arrangement makes it possible to attain the peripheral resin portions in substantially even width, the peripheral resin portions being formed on sides of the semiconductor element. Further, the width of the peripheral resin portion on the other one of the longitudinal side can be smaller.

Therefore, it becomes possible to provide (a) a semiconductor device in which the width of the sealing resin for protecting the semiconductor element is small the flexible region is large whereby miniaturization of the semiconductor device is possible, and (b) a manufacturing method of the semiconductor device.

Further, this arrangement makes it easier for the air bubble to escape from the sealing resin before the resin is cured, the air bubble being trapped in the sealing resin in filling with the sealing resin the gap between the semiconductor element and the flexible wiring substrate. Thus, it becomes possible to prevent the air bubble from being remained in the sealing resin. Therefore, it becomes possible to eliminate the air gap in the sealing resin, thereby attaining higher quality of the semiconductor device.

Moreover, the semiconductor device and the manufacturing method thereof according to the present invention are preferably arranged such that the sealing resin has a temperature in a range of 60 to 120° C., when applied. Furthermore, the semiconductor device and the manufacturing method thereof according to the present invention are preferably arranged such that the semiconductor device is heated so as to increase the temperature of the sealing resin being be introduced. This arrangement overcomes the problems associated with an arrangement in which the sealing resin is heated. In the arrangement in which the sealing resin is heated, the curing of the sealing resin causes an increases of the viscosity of the sealing resin. The increases of the viscosity of the sealing resin shorten the pot life and clogging the nozzle with the sealing resin. Therefore, this arrangement of the present invention attains higher workability.

The arrangement of the present invention lowers the viscosity of the resin as low as possible, thereby attaining high flowability of the sealing resin. Further, with the arrangement in which the sealing resin is heated, the sealing resin would drip off from the nozzle. Furthermore, with the arrangement in which the sealing resin is heated, the temperature of the resin is lowered by being subjected to a low temperature right after being introduced. This would increase the viscosity. Therefore, it is preferable to increase the temperature of the sealing resin by heating the semiconductor element.

Moreover, the semiconductor device and its manufacturing method according to the present invention are preferably arranged such that the sealing resin contains a coloring agent by 0.10 to 0.30% by weight.

With this arrangement, it becomes easy to distinguish the peripheral resin portions from the resin trance by visual inspection.

Moreover, the semiconductor device according to the present invention is preferably arranged such that the resin trace is only along one longitudinal side of the semiconductor element.

Further, the manufacturing method of the semiconductor device according to the present invention are preferably arranged such that the step of applying the sealing resin is carried out by applying the sealing resin only along one longitudinal side of the semiconductor element via the nozzle.

This reduces the tack time necessary for the application of the sealing resin, thereby improving the throughout of the resin applying device.

Further, the semiconductor device and the manufacturing method thereof according to the present invention are preferably arranged such that a plurality of the flexible wiring substrates are sequentially formed on a film carrier tape; and a plurality of the semiconductor elements are mounted respectively on the plurality of the flexible wiring substrates, or arranged such as to comprise: forming a plurality of the flexible wiring substrates sequentially on a film carrier tape; and mounting a plurality of the semiconductor elements respectively on the plurality of the flexible wiring substrates.

With either arrangement, it is possible to provide a tape-carrier type semiconductor device.

Moreover, the semiconductor device and the manufacturing method thereof according to the present invention are preferably arranged such that the flexible wiring substrate is connected to a liquid crystal module provided with a liquid crystal display device and a peripheral component, or arranged such as to comprise connecting the flexible wiring substrate to the liquid crystal module provided with a liquid crystal display device and a peripheral component.

With either arrangement, it is possible to apply the semiconductor device to the liquid crystal module provided with a liquid crystal display device and a peripheral component.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A semiconductor device in which a semiconductor element is mounted on a flexible wiring substrate having a film-like shape and a wiring pattern thereon, wherein:
   a sealing resin fills a gap between the flexible wiring substrate and the semiconductor element, the sealing resin protecting the semiconductor element;
   a resin trace and peripheral resin portions are formed when the sealing resin is applied along at least one longitudinal side of the semiconductor element via a nozzle;
   the resin trace remains on an area through which the sealing resin is applied via the nozzle and the resin trace is formed only at the one longitudinal side of the semiconductor element; and
   the resin trace is 0.1 to 1.0 mm in width and not more than 10 µm in thickness.

2. The semiconductor device of claim 1, wherein
   the peripheral resin portions were formed respectively on longitudinal sides of the semiconductor element when the sealing resin is applied along one of the longitudinal sides of the semiconductor element via a nozzle; and the peripheral resin portion on one of the longitudinal sides is not more than 1.0 mm in width from the semiconductor element, and the peripheral resin portion on the other one of the longitudinal sides is not more than 0.8 mm.

3. The semiconductor device as set forth in claim 2, wherein: the sealing resin has a viscosity in a range of 50 to 600 mPa·S at 25° C.

4. The semiconductor device as set forth in claim 2, wherein: the sealing resin has a temperature in a range of 60 to 120° C., when applied.

5. The semiconductor device as set forth in claim 2, wherein: the sealing resin contains a coloring agent by 0.10 to 0.30% by weight.

6. The semiconductor device as set forth in claim 2, wherein:

a plurality of the flexible wiring substrates are sequentially formed on a film carrier tape; and a plurality of the semiconductor elements are mounted respectively on the plurality of the flexible wiring substrates.

7. A semiconductor device as set forth in claim 2, wherein: the flexible wiring substrate is connected to a liquid crystal module provided with a liquid crystal display device and a peripheral component.

8. The semiconductor device as set forth in claim 1, wherein:

the sealing resin has a viscosity in a range of 50 to 600 mPa·S at 25° C.

9. The semiconductor device as set forth in claim 1, wherein: the sealing resin has a temperature in a range of 60 to 120° C., when applied.

10. The semiconductor device as set forth in claim 1, wherein: the sealing resin contains a coloring agent by 0.10 to 0.30% by weight.

11. The semiconductor device as ser forth in claim 1, wherein: the resin trace is only along one longitudinal side of the semiconductor element.

12. The semiconductor device as set forth in claim 1, wherein:

a plurality of the flexible wiring substrates are sequentially formed on a film carrier tape; and a plurality of the semiconductor elements are mounted respectively on the plurality of the flexible wiring substrates.

13. A semiconductor device as set forth in claim 1, wherein:

the flexible wiring substrate is connected to a liquid crystal module provided with a liquid crystal display device and a peripheral component.

* * * * *